(12) United States Patent
Yang et al.

(10) Patent No.: US 12,356,689 B2
(45) Date of Patent: Jul. 8, 2025

(54) TRANSISTOR STACKS HAVING INSULATING SPACERS, AND RELATED FABRICATION METHODS

(71) Applicant: Samsung Electronics Co., Ltd., Suwon-si (KR)

(72) Inventors: Myung Yang, Niskayuna, NY (US); Seung Min Song, Clifton Park, NY (US); Kang-Ill Seo, Springfield, VA (US)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 18/611,923

(22) Filed: Mar. 21, 2024

(65) Prior Publication Data

US 2025/0133801 A1 Apr. 24, 2025

Related U.S. Application Data

(60) Provisional application No. 63/592,266, filed on Oct. 23, 2023.

(51) Int. Cl.
*H10D 64/01* (2025.01)
*H10D 30/01* (2025.01)
*H10D 30/43* (2025.01)
*H10D 30/67* (2025.01)
*H10D 84/85* (2025.01)

(52) U.S. Cl.
CPC ......... *H10D 64/021* (2025.01); *H10D 30/014* (2025.01); *H10D 30/43* (2025.01); *H10D 30/6757* (2025.01); *H10D 84/85* (2025.01); *H10D 30/6735* (2025.01)

(58) Field of Classification Search
CPC ............... H01L 29/6656; H01L 27/092; H01L 29/66439; H01L 29/775; H01L 29/78696; H01L 29/42392; H01L 29/0669–068; H01L 29/0665; H01L 29/66469; H01L 21/28132–2815; H01L 29/66689; H01L 29/66719; H10D 64/021; H10D 30/014; H10D 30/6757; H10D 84/85; H10D 30/6735; H10D 30/501–509; H10D 30/43–435; H10D 62/119–123; H10D 64/675–679
See application file for complete search history.

(56) References Cited

U.S. PATENT DOCUMENTS 11,502,183 B2 11/2022 Yao et al.
11,605,711 B2 3/2023 Yu et al.
(Continued)

*Primary Examiner* — Shahed Ahmed
(74) *Attorney, Agent, or Firm* — Myers Bigel, P.A.

(57) ABSTRACT

Transistor devices are provided. A transistor device includes a substrate and a transistor stack including first and second transistors on the substrate. The first transistor or the second transistor includes a plurality of semiconductor channel layers, a gate on the plurality of semiconductor channel layers, and an insulating spacer that is on a sidewall of the gate and between the plurality of semiconductor channel layers. Moreover, the insulating spacer includes: a first portion on a sidewall of the gate; and a second portion that is spaced apart from the sidewall of the gate by the first portion, and that has a lower dielectric constant than the first portion. Related methods of forming transistor devices are also provided.

20 Claims, 12 Drawing Sheets

(56) References Cited

U.S. PATENT DOCUMENTS

| | | |
|---|---|---|
| 11,670,718 B2 | 6/2023 | Yeong et al. |
| 11,728,402 B2 | 8/2023 | Liaw |
| 11,791,421 B2 | 10/2023 | Yeong et al. |
| 2017/0200738 A1* | 7/2017 | Kim .................. H01L 29/66439 |
| 2017/0256608 A1* | 9/2017 | Suk .................... H01L 29/6656 |
| 2019/0081152 A1* | 3/2019 | Suh .................. H01L 29/66545 |
| 2019/0157414 A1* | 5/2019 | Ando ................ H01L 21/02603 |
| 2021/0210613 A1* | 7/2021 | Cho .................. H01L 21/31111 |
| 2021/0376119 A1 | 12/2021 | Wang et al. |
| 2022/0052181 A1* | 2/2022 | Lin .................... H01L 29/0673 |
| 2022/0320276 A1* | 10/2022 | Lin .................... H01L 29/4991 |
| 2023/0253478 A1 | 8/2023 | Wong et al. |

\* cited by examiner

TRANSISTOR STACKS HAVING INSULATING SPACERS, AND RELATED FABRICATION METHODS

RELATED APPLICATIONS

The present application claims the benefit of U.S. Provisional Patent Application Ser. No. 63/592,266, filed on Oct. 23, 2023, entitled INTEGRATED CIRCUIT DEVICES AND METHODS OF FORMING THE SAME, the disclosure of which is hereby incorporated herein in its entirety by reference.

TECHNICAL FIELD

The present disclosure generally relates to the field of semiconductor devices and, more particularly, to three-dimensional transistor structures.

BACKGROUND

The density of transistors in electronic devices has continued to increase as planar transistor structures have evolved into non-planar, or three-dimensional (3D), transistor structures such as fin field-effect transistors (FinFETs), gate-all-around FETs (GAAFETs), and multi-bridge channel FETs (MBCFETs™). Moreover, the size of transistors has continued to decrease to facilitate the scale-down of logic elements. It may be difficult and complicated, however, to form some features of 3D transistor structures. For example, though transistors may be stacked on top of each other, it may be difficult to implement gate-metal processes because stacked transistors in 3D transistor structures may have high aspect-ratio gates.

SUMMARY

A transistor device, according to some embodiments herein, may include a substrate and a transistor stack including first and second transistors on the substrate. The first transistor may include a plurality of first semiconductor channel layers, a first gate between the plurality of first semiconductor channel layers, and a first insulating spacer that is on a sidewall of the first gate and between the plurality of first semiconductor channel layers. The first insulating spacer may include an inner portion that includes an oxide or a vacancy.

A transistor device, according to some embodiments herein, may include a substrate and a transistor stack including first and second transistors on the substrate. The first transistor or the second transistor may include a plurality of semiconductor channel layers, a gate on the plurality of semiconductor channel layers, and an insulating spacer that is on a sidewall of the gate and between the plurality of semiconductor channel layers. Moreover, the insulating spacer may include: a first portion on a sidewall of the gate; and a second portion that is spaced apart from the sidewall of the gate by the first portion, and that has a lower dielectric constant than the first portion.

A method of forming a transistor device, according to some embodiments herein, may include forming an insulating spacer between a plurality of semiconductor channel layers of a first transistor. Forming the insulating spacer may include: forming a first insulating material between the plurality of semiconductor channel layers; and forming a second insulating material on a sidewall of the first insulating material and between the plurality of semiconductor channel layers. The first transistor may be in a transistor stack with a second transistor. Moreover, the second insulating material may include a lower dielectric constant than the first insulating material.

DETAILED DESCRIPTION

Pursuant to embodiments herein, transistor devices are provided that include insulating spacers. Though a conventional insulating spacer may advantageously separate a gate from a contact, the conventional insulating spacer may result in an undesirably-high capacitance. Accordingly, insulating spacers according to embodiments herein may reduce the capacitance by including a portion that has a lower dielectric constant than silicon nitride (e.g., $Si_3N_4$), as capacitance is directly proportional to dielectric constant.

In some embodiments, a transistor device may include a transistor stack having an upper transistor and a lower transistor. At least one of the upper transistor or the lower transistor may include a gate and an insulating spacer on a sidewall thereof. The insulating spacer and the gate may be between a plurality (e.g., a pair) of semiconductor channel layers. Example transistor stacks comprising insulating spacers are described in U.S. Patent Application Publication No. 2023/0395659, entitled TRANSISTOR STACKS HAVING SPACERS, AND RELATED FABRICATION METHODS, the disclosure of which is hereby incorporated herein in its entirety by reference.

To facilitate a reduced capacitance, an insulating spacer according to embodiments herein may include an inner portion that comprises an oxide or a vacancy (or that otherwise has a lower dielectric constant than silicon nitride). An outer portion of the insulating spacer may comprise a nitride and may border at least two sides of a cross-section of the inner portion. Moreover, in contrast with some conventional insulating spacers, the insulating spacer may be free of (i.e., may not contain) carbon.

According to some embodiments, insulating spacers having a low dielectric-constant inner portion (e.g., lower than the dielectric constant of silicon nitride) may selectively be included in different types of metal oxide-semiconductor field-effect transistors (MOSFETs) that are in a transistor stack. For example, insulating spacers having a low dielectric-constant inner portion may be included in a p-channel MOS (PMOS) transistor of the transistor stack and insulating spacers having only silicon nitride may be included in an n-channel MOS (NMOS) transistor of the transistor stack, or vice versa, depending on the specifications of a transistor device that includes the transistor stack. Accordingly, insulating spacers having a low dielectric-constant inner portion can be in either the NMOS transistor or the PMOS transistor. In some embodiments, insulating spacers having a low dielectric-constant inner portion may be included in both the NMOS transistor and the PMOS transistor. Moreover, the PMOS and NMOS transistors may be upper and lower transistors, respectively, or vice versa.

Example embodiments will be described in greater detail with reference to the attached figures.

Figure 1:
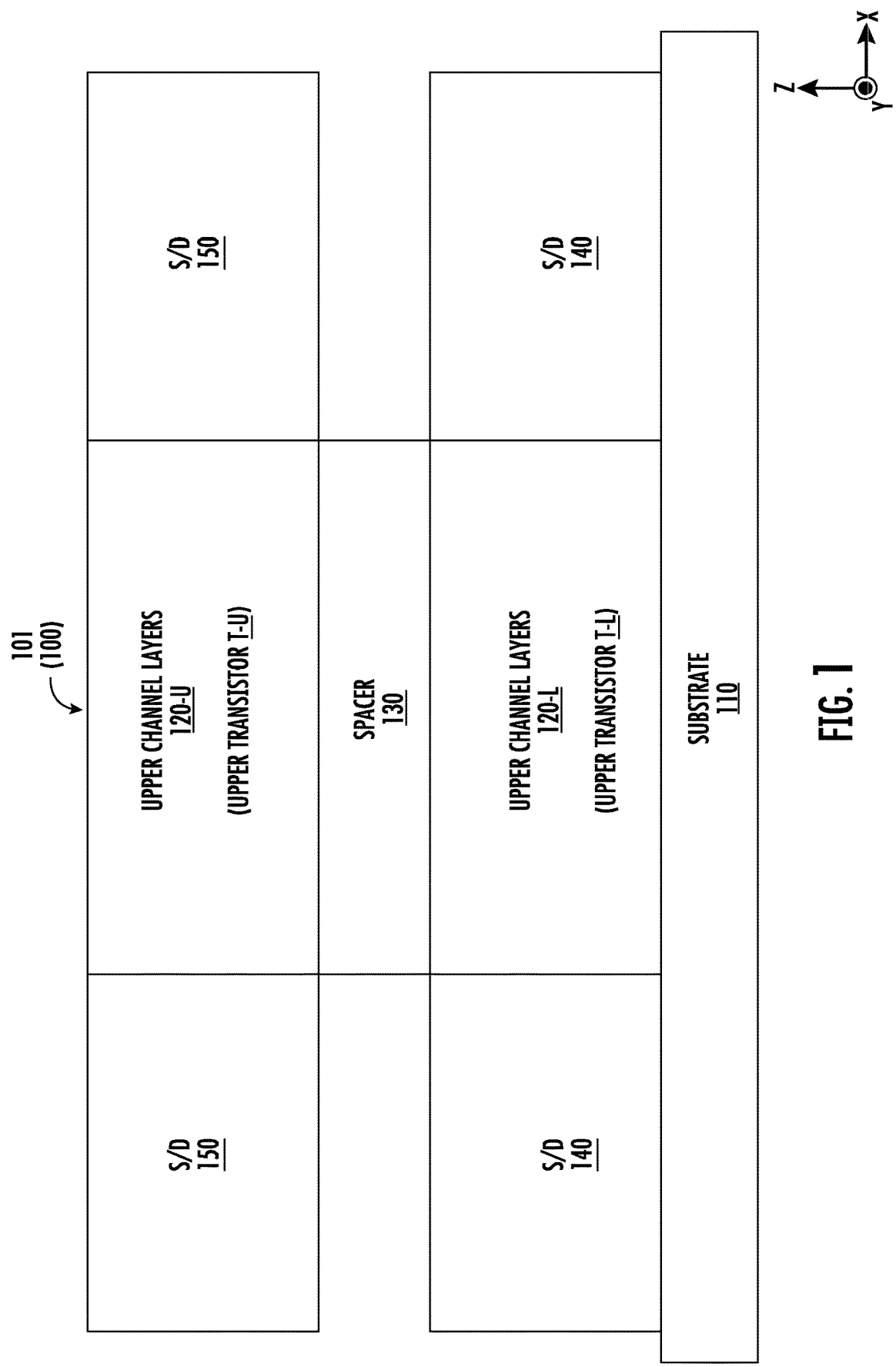
FIG. 1 is a schematic block diagram of a transistor stack of a transistor device according to some embodiments herein.

FIG. 1 is a schematic block diagram of a transistor stack 101 of a transistor device 100 according to some embodiments herein. The transistor stack 101 includes a lower transistor T-L having a stack of a plurality of lower semiconductor channel layers 120-L and an upper transistor T-U having a stack of a plurality of upper semiconductor channel layers 120-U. The lower transistor T-L is between, in a vertical direction Z, the upper transistor T-U and a substrate 110 (e.g., a silicon, or other semiconductor, substrate). Moreover, a middle dielectric isolation layer 130 may, in some embodiments, be between the lower and upper transistors T-L, T-U.

The lower channel layers 120-L of the lower transistor T-L are between, in a first horizontal direction X, a pair of lower source/drain (S/D) regions 140 that are electrically connected to the lower channel layers 120-L. The first horizontal direction X and the vertical direction Z may be perpendicular to each other, and a second horizontal direction Y may be perpendicular to each of the first horizontal direction X and the vertical direction Z. Each lower channel layer 120-L may be implemented by, for example, a nanosheet or nanowire between the lower S/D regions 140. Likewise, the upper channel layers 120-U of the upper transistor T-U are between, in the first horizontal direction X, a pair of upper S/D regions 150 that are electrically connected to the upper channel layers 120-U. Each upper channel layer 120-U may be implemented by, for example, a nanosheet or nanowire between the upper S/D regions 150.

In some embodiments, the upper S/D regions 150 may include a different semiconductor material from that of the lower S/D regions 140. For example, the upper S/D regions 150 may include silicon germanium, and the lower S/D regions 140 may include silicon carbide, or vice versa.

For simplicity of illustration, only one transistor stack 101 is shown in FIG. 1. In some embodiments, however, the device 100 may include two, three, four, or more transistor stacks 101.

Figure 2A:
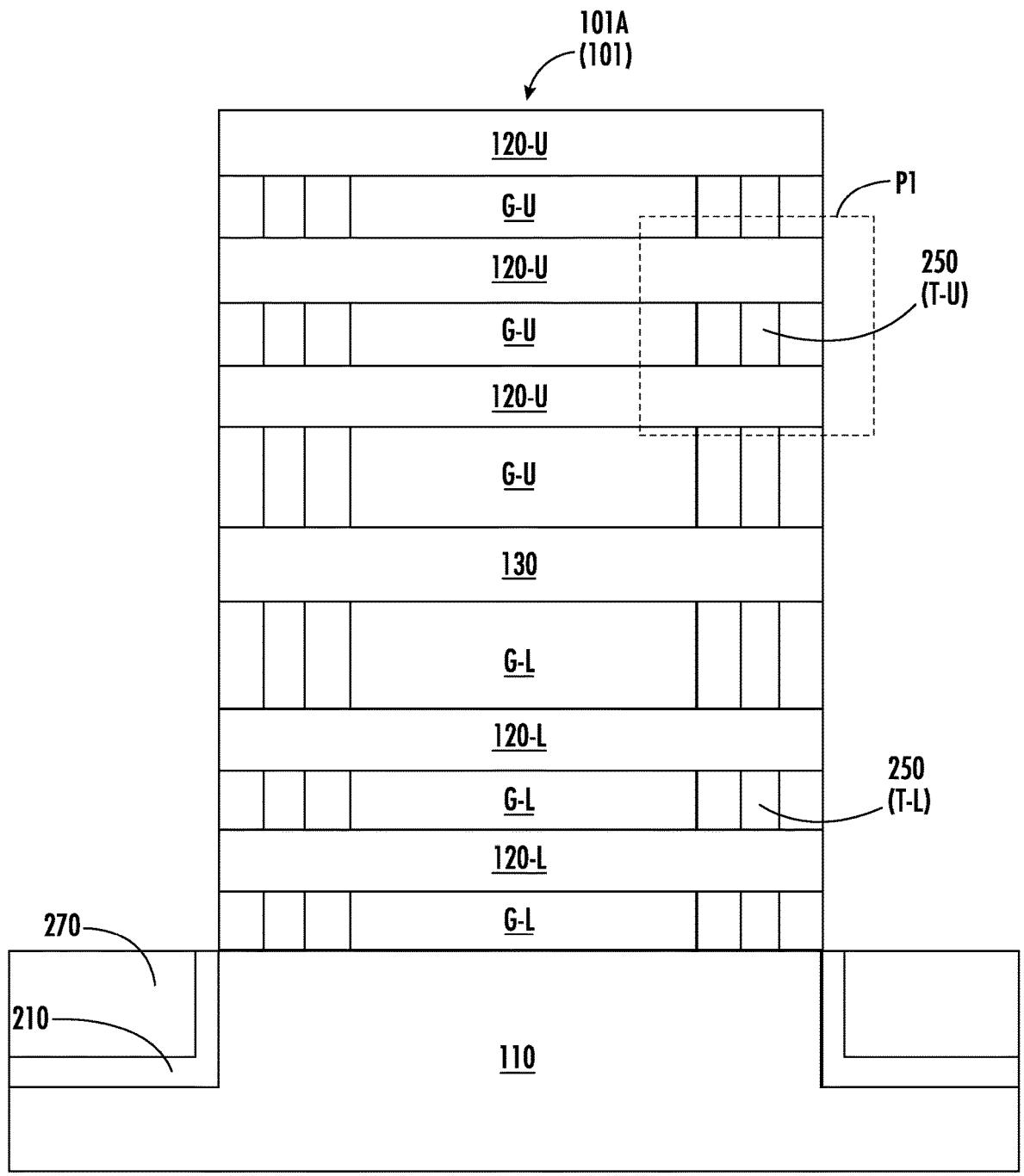
FIGS. 2A-2C are example cross-sectional views of the transistor stack of FIG. 1.
Figure 2B:
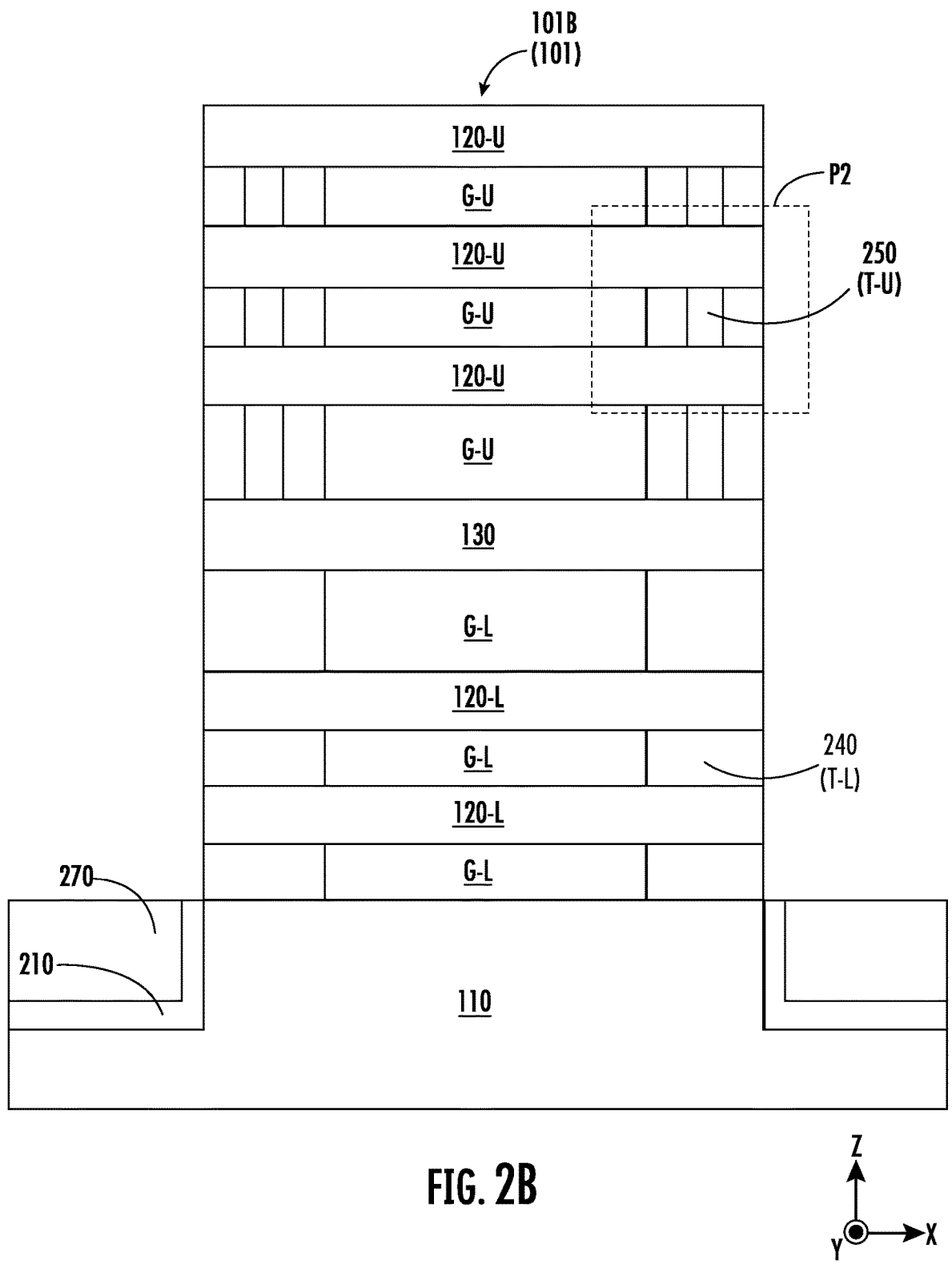
Figure 2C:
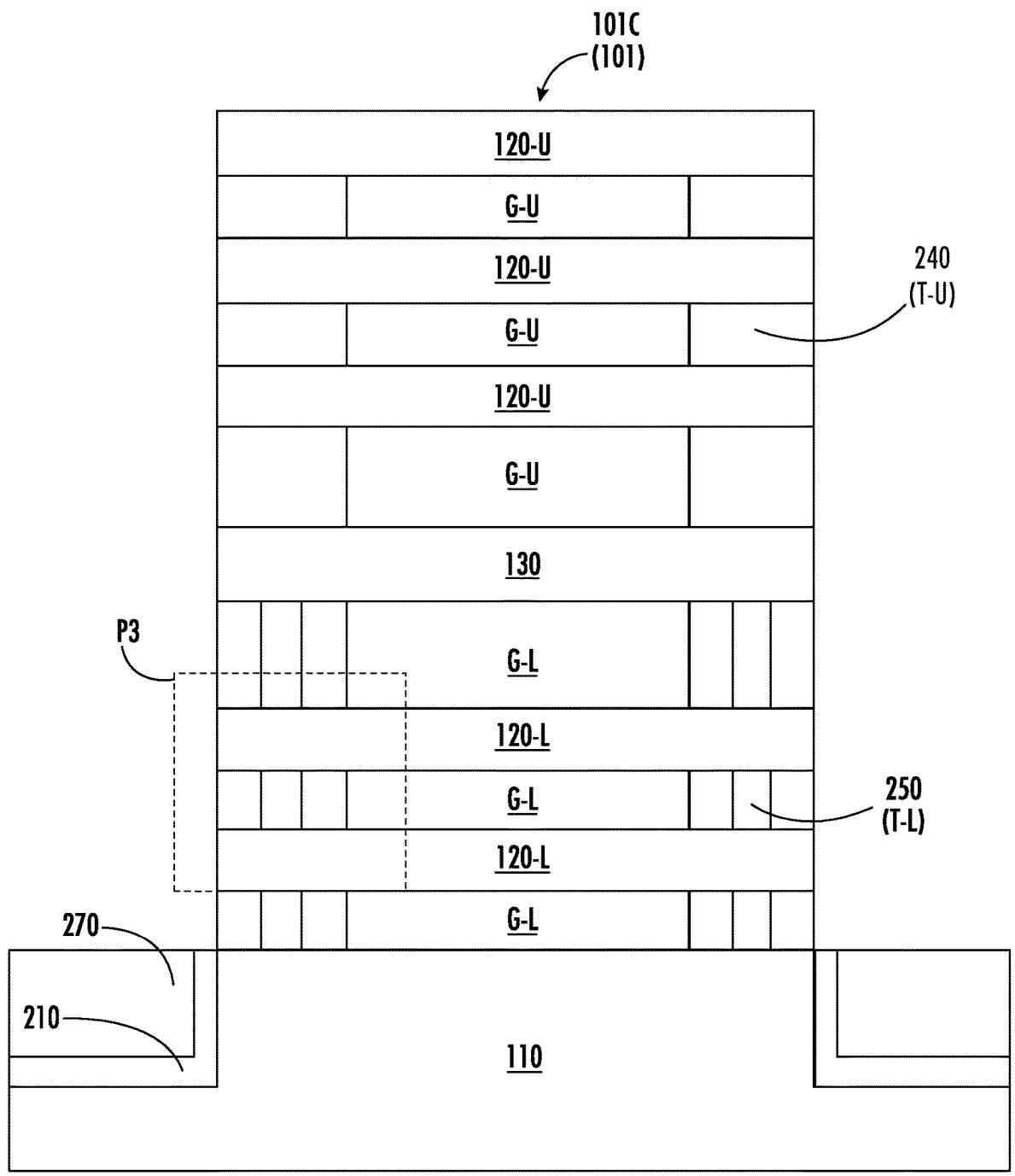

FIGS. 2A-2C are example cross-sectional views of the transistor stack 101 of FIG. 1. Transistor stacks 101A, 101B, 101C in FIGS. 2A-2C are different examples of the transistor stack 101. The structures shown in FIGS. 2A-2C include insulating spacers 250 that are selectively formed in the lower transistor T-L and/or the upper transistor T-U.

The spacers 250 each have an outer portion and an inner portion that has a lower dielectric constant than the outer portion. The inner portion may be an interior (e.g., center/middle) portion that is bounded on at least two sides by the outer portion. Examples of the inner and outer portions are discussed in more detail with respect to FIGS. 3A-3C, 4A, and 4B.

As shown in FIG. 2A, the spacers 250 may be in both the lower and upper transistors T-L, T-U of the transistor stack 101A. Alternatively, the spacers 250 may be only in the lower transistor T-L or only in the upper transistor T-U. For example, FIG. 2B shows that the spacers 250 may be only in the upper transistor T-U of the transistor stack 101B. Instead of having the spacers 250 in both the lower and upper transistors T-L, T-U, the lower transistor T-L in FIG. 2B has insulating spacers 240 that, unlike the spacers 250, do not have a low dielectric-constant inner portion (e.g., lower than a dielectric constant of silicon nitride). As an example, the spacers 240 may comprise only silicon nitride and may be in places where the spacers 250 might otherwise be present. FIG. 2C is another example in which the spacers 250 are not in both the lower and upper transistors T-L, T-U. Rather, FIG. 2C shows that the spacers 250 are in the lower transistor T-L of the transistor stack 101C, whereas the spacers 240 are in the upper transistor T-U.

Accordingly, in a transistor stack 101, the spacers 250 are present in at least one of the transistors T-L, T-U. The spacers 240, 250 may also be referred to herein as "inner spacers," as they may be situated between channel layers 120 (e.g., nanosheet/nanowire channels) within a transistor.

For simplicity of illustration, the upper S/D regions 150 and the lower S/D regions 140 shown in FIG. 1 are omitted from view in FIGS. 2A-2C. Referring to FIG. 2A together with FIG. 1, though sidewalls of the lower channel layers 120-L of the lower transistor T-L may contact the lower S/D regions 140, a lower gate G-L of the lower transistor T-L may be spaced apart from the lower S/D regions 140 in the first horizontal direction X by spacers 250. The spacers 250 may be on sidewalls of the lower gate G-L and between, in the vertical direction Z, the lower channel layers 120-L. According to some embodiments, the spacers 250 may contact the lower S/D regions 140 and sidewalls of the lower gate G-L. The lower gate G-L may be on the lower channel layers 120-L, and the upper gate G-U may be on the upper channel layers 120-U.

FIG. 2A also shows spacers 250 in the upper transistor T-U. Though sidewalls of the upper channel layers 120-U of the upper transistor T-U may contact the upper S/D regions 150, an upper gate G-U of the upper transistor T-U may be spaced apart from the upper S/D regions 150 in the first horizontal direction X by spacers 250. The spacers 250 may be on sidewalls of the upper gate G-U and between, in the vertical direction Z, the upper channel layers 120-U. In some embodiments, the spacers 250 may contact the upper S/D regions 150 and sidewalls of the upper gate G-U.

Referring to FIGS. 1 and 2B, spacers 250 may be positioned in the upper transistor T-U as described with respect to FIG. 2A. Moreover, though sidewalls of the lower channel layers 120-L of the lower transistor T-L may contact the lower S/D regions 140, a lower gate G-L of the lower transistor T-L may be spaced apart from the lower S/D regions 140 in the first horizontal direction X by spacers 240. The spacers 240 may be on sidewalls of the lower gate G-L and between, in the vertical direction Z, the lower channel layers 120-L. According to some embodiments, the spacers 240 may contact the lower S/D regions 140 and sidewalls of the lower gate G-L.

Referring to FIGS. 1 and 2C, spacers 250 may be positioned in the lower transistor T-L as described with respect to FIG. 2A. Moreover, though sidewalls of the upper channel layers 120-U of the upper transistor T-U may contact the upper S/D regions 150, an upper gate G-U of the upper transistor T-U may be spaced apart from the upper S/D regions 150 in the first horizontal direction X by spacers 240. The spacers 240 may be on sidewalls of the upper gate G-U and between, in the vertical direction Z, the upper channel layers 120-U. According to some embodiments, the spacers 240 may contact the upper S/D regions 150 and sidewalls of the upper gate G-U.

Referring to each of FIGS. 2A-2C, the upper and lower transistors T-U, T-L in a transistor stack 101 may be different types of MOSFETs. For example, the upper and lower transistors T-U, T-L may be PMOS and NMOS transistors, respectively, or vice versa. As an example, PMOS and NMOS transistors may be provided by S/D regions comprising silicon germanium and silicon carbide, respectively. In some embodiments, a middle dielectric isolation layer 130 may comprise an isolation region that separates the lower channel layers 120-L of the lower transistor T-L from the upper channel layers 120-U of the upper transistor T-U. Moreover, in embodiments where the spacers 250 are in only the upper transistor T-U or only the lower transistor T-L, the middle dielectric isolation layer 130 may separate the spacers 250 from the spacers 240. The middle dielectric isolation layer 130 may be wider, in the first horizontal direction X, than each of the spacers 240, 250 and each of the gates G. For example, the middle dielectric isolation layer 130 may have the same width as each of the channel layers 120.

For simplicity of illustration, a gate insulation layer is omitted from view in FIGS. 2A-2C. It will be understood, however, that a gate insulation layer may extend between each channel layer 120 and a gate G. For example, a gate insulation layer may be between each upper channel layer 120-U and the upper gate G-U, and may be between each lower channel layer 120-L and the lower gate G-L. The gate insulation layer may wrap around each channel layer 120 and may be thinner than the middle dielectric isolation layer 130.

According to some embodiments, an insulating layer 210 may be in a recess of the substrate 110. An insulating layer 270 may also be in the recess. The middle dielectric isolation layer 130 and/or the insulating layers 210, 270 may comprise, for example, silicon oxide, silicon oxynitride, silicon nitride, or a low-k dielectric material. As used herein, the term "low-k" refers to a material that has a smaller dielectric constant than silicon dioxide. The low-k material may include, for example, fluorine-doped silicon dioxide, organosilicate glass, carbon-doped oxide, porous silicon dioxide, porous organosilicate glass, a spin-on organic polymeric dielectric, or a spin-on silicon based polymeric dielectric.

Figure 3A:
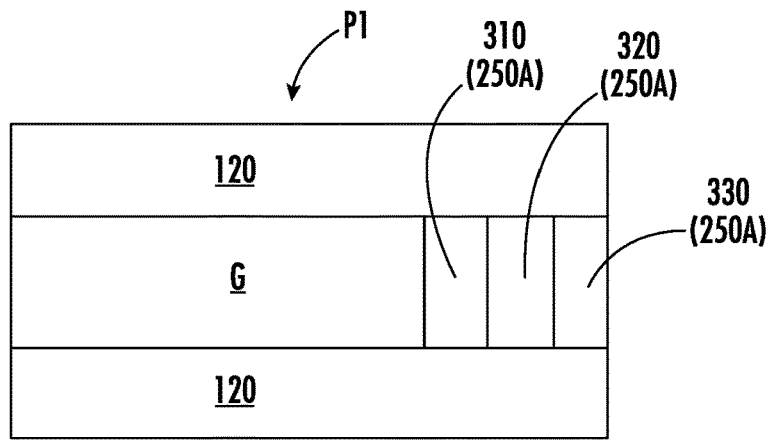
FIGS. 3A-3C are example enlarged views of a portion of the transistor stack of FIG. 2A.
Figure 3B:
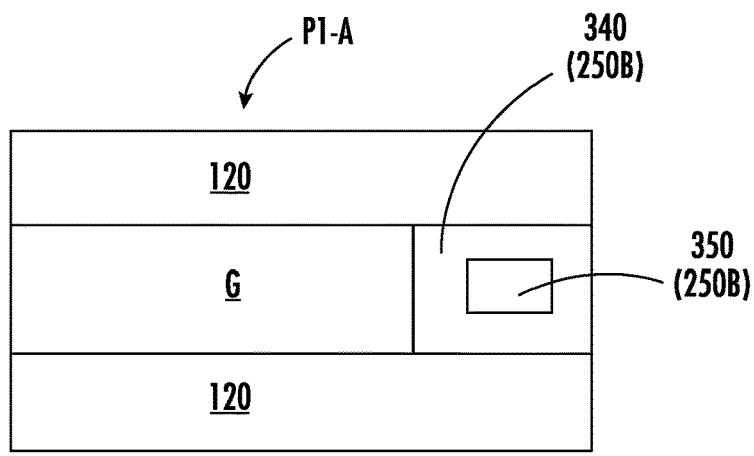
Figure 3C:
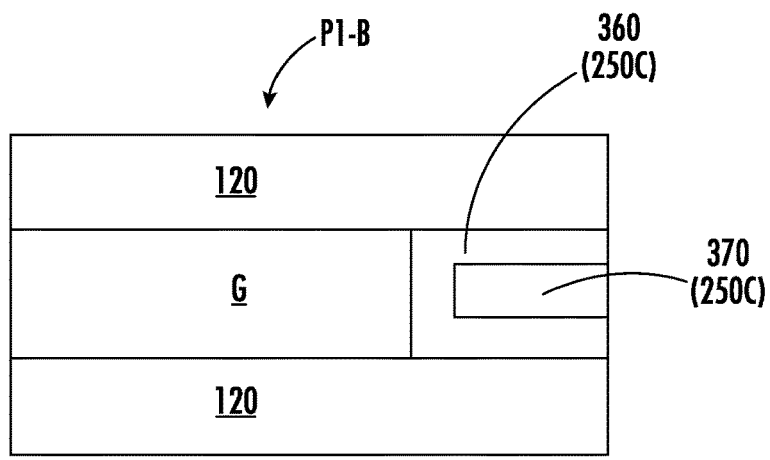

FIGS. 3A-3C are example enlarged views of a portion P1 of the transistor stack 101A of FIG. 2A. The portion P1 is similar to, or the same as, a portion P2 of the transistor stack 101B of FIG. 2B. The portions P1, P2 are on the right side of the upper transistor T-U. Moreover, though a portion P3 of the transistor stack 101C is on the left side of the lower transistor T-L, a spacer 250 that is in the portion P3 may have the same structure (e.g., an inner portion and an outer portion) as spacers 250 in the portions P1, P2.

Insulating spacers 250A, 250B, 250C in FIGS. 3A-3C are different examples of the spacer 250. As shown in FIG. 3A, the spacer 250A includes a first outer portion 310, a second outer portion 330, and an inner portion 320 that is between the outer portions 310, 330. The inner portion 320 is spaced apart, in the first horizontal direction X (FIG. 2A), from a gate G (e.g., a sidewall thereof) by the outer portion 310. Also, the inner portion 320 has a different insulating material from that of the outer portions 310, 330. For example, the inner portion 320 may have a lower dielectric constant than the outer portions 310, 330. As an example, the inner portion 320 may comprise silicon oxide, and the outer portions 310, 330 may comprise silicon nitride. In some embodiments, the spacer 250A may be free of carbon, and the inner portion 320 may be free of nitrogen.

A cross-section of an inner portion of a spacer 250 may be bounded by outer portion(s) of the spacer 250 on at least two sides. In the cross-section shown in FIG. 3A, the inner portion 320 is bounded by (e.g., in contact with) the outer portions 310, 330 on two sides. For example, the inner portion 320 and the outer portions 310, 330 may each have the same vertical thickness in the vertical direction Z (FIG. 2A). Accordingly, the outer portions 310, 330 may not intervene between the inner portion 320 and the channel layers 120 in the vertical direction Z. Moreover, the outer portions 310, 330 may include the same insulating material, and may collectively be referred to as an "outer portion" that borders the inner portion 320.

Referring to FIG. 3A together with FIG. 2A, spacers 250 in the lower transistor T-L may be aligned with spacers 250 in the upper transistor T-U. For example, an inner portion 320 (e.g., sidewalls thereof) of a spacer 250 in the lower transistor T-L may be aligned with an inner portion 320 (e.g., sidewalls thereof) of a spacer 250 in the upper transistor T-U. Accordingly, a vertical axis may extend, in the vertical direction Z, through both the inner portion 320 of the spacer 250 in the lower transistor T-L and the inner portion 320 of the spacer 250 in the upper transistor T-U.

As shown in FIGS. 3B and 3C, a cross-section of the inner portion of the spacer 250 may be bounded the outer portion on more than two sides. For example, FIG. 3B shows a portion P1-A that differs from the portion P1 (FIG. 3A), in that an inner portion 350 of a spacer 250B is bounded by an outer portion 340 of the spacer 250B on four sides. As an example, the outer portion 340 extends continuously around the perimeter of the inner portion 350 in the cross-section shown in FIG. 3B. The inner portion 350 is thinner, in the vertical direction Z, and wider, in the first horizontal direction X (FIG. 2A), than the inner portion 320 (FIG. 3A).

FIG. 3C shows a portion P1-B that differs from the portion P1 (FIG. 3A), in that an inner portion 370 of a spacer 250C is bounded by an outer portion 360 of the spacer 250C on three sides. Accordingly, the outer portion 360 may be C-shaped. The inner portion 370 is thinner, in the vertical direction Z, and wider, in the first horizontal direction X, than the inner portion 320 (FIG. 3A). Moreover, the inner portion 370 is wider, in the first horizontal direction X, than the inner portion 350 (FIG. 3B). For example, the inner portion 370 may protrude as close as the outer portion 360 to an S/D region. In some embodiments, the inner portion 370 and the outer portion 360 may both contact the S/D region.

The inner portions 320, 350, 370 may each have a first solid insulating material having a lower dielectric constant than silicon nitride. The outer portions 310, 330, 340, 360 may each have a second solid insulating material having a dielectric constant higher than that of the inner portions 320, 350, 370. As an example, the first and second insulating materials may be silicon oxide (e.g., $SiO_2$) and silicon nitride (e.g., $Si_3N_4$), respectively, and may be free of carbon.

Figure 4A:
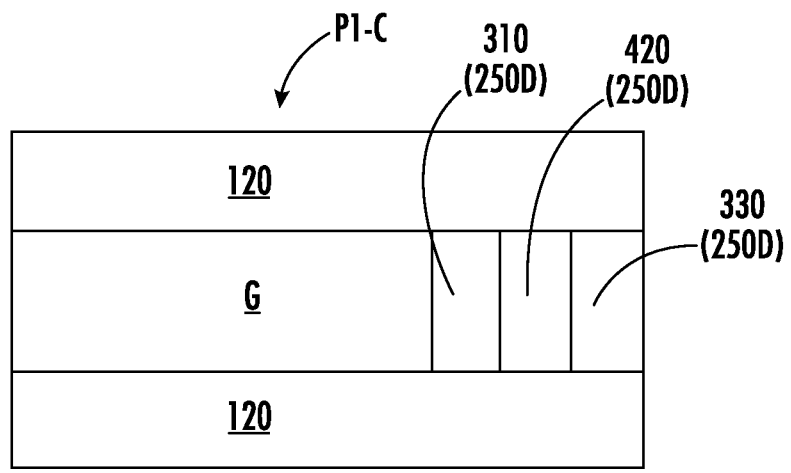
FIGS. 4A and 4B are example enlarged views of a portion of the transistor stack of FIG. 2A having a vacancy in an insulating spacer.
Figure 4B:
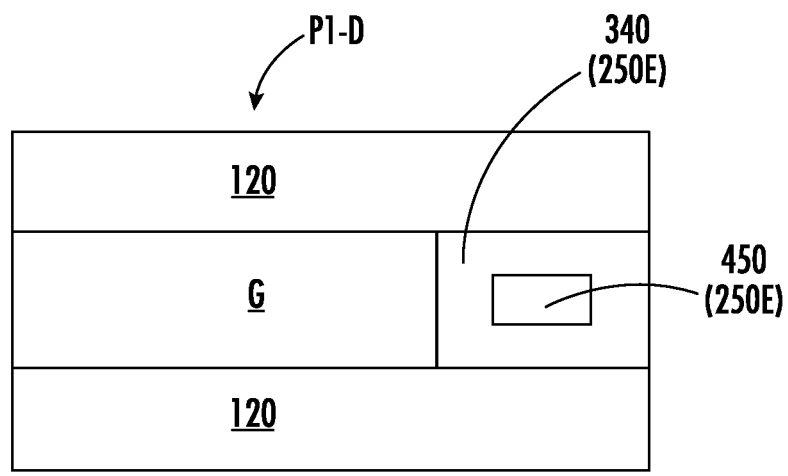

FIGS. 4A and 4B are example enlarged views of a portion P1 of the transistor stack 101A of FIG. 2A having a vacancy in the spacer 250. FIG. 4A shows a portion P1-C that differs from the portion P1 (FIG. 3A), in that the solid insulating material of the inner portion 320 (FIG. 3A) is replaced with a vacancy 420. Accordingly, FIG. 4A shows a spacer 250D having the vacancy 420 between the outer portions 310, 330. In some embodiments, the vacancy 420 may comprise air or another gas. The vacancy 420 may thus comprise an air gap according to some embodiments.

FIG. 4B shows a portion P1-D that differs from the portion P1-A (FIG. 3B), in that the solid insulating material of the inner portion 350 (FIG. 3B) is replaced with a vacancy 450. Accordingly, FIG. 4B shows a spacer 250E having the vacancy 450 inside the outer portion 340. In some embodiments, the vacancy 450 may comprise air or another gas.

Figure 5A:
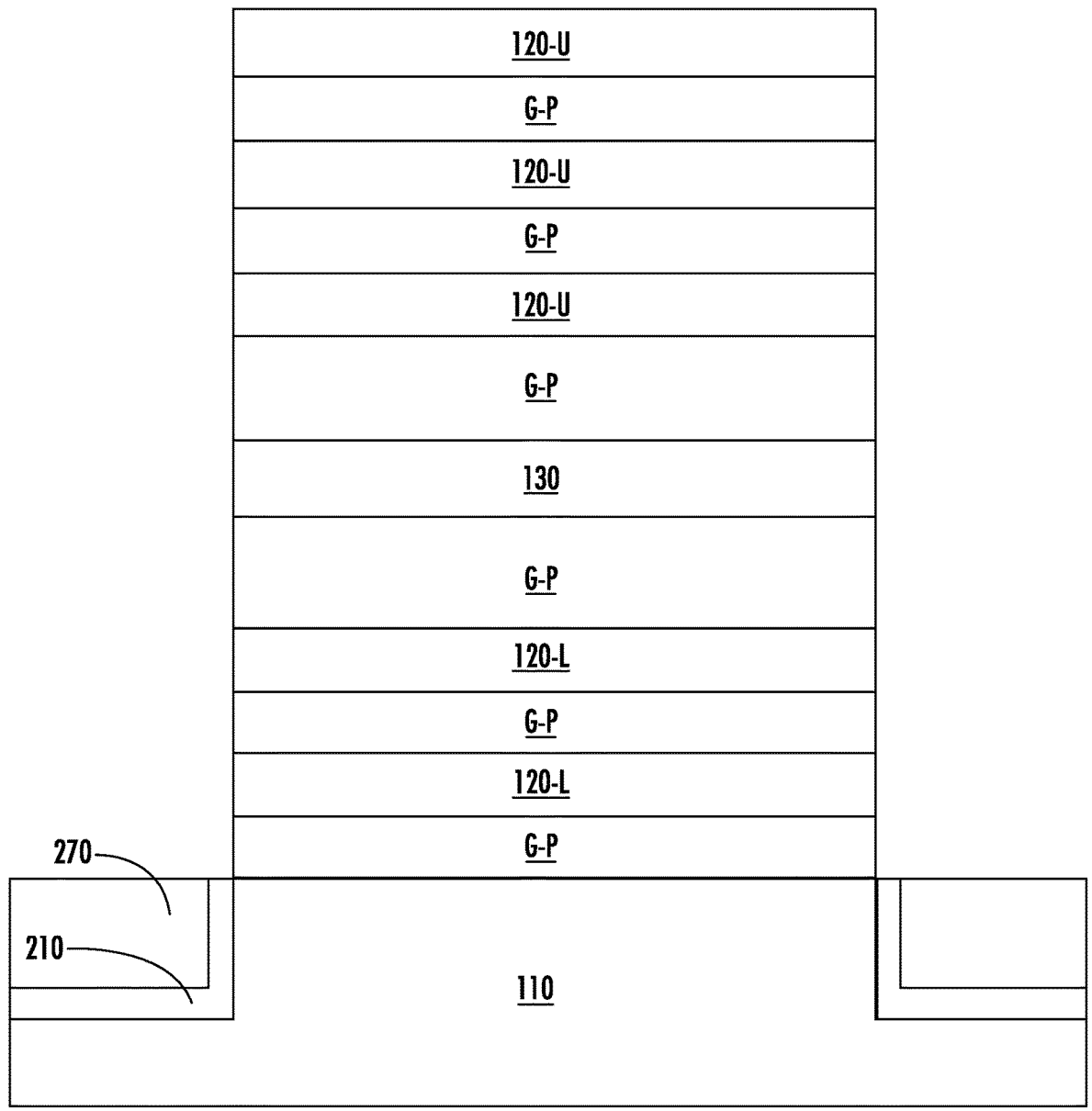
FIGS. 5A-5E are cross-sectional views illustrating operations of forming the transistor stack of FIG. 2A.

FIGS. 5A-5E are cross-sectional views illustrating operations of forming the transistor stack 101A of FIG. 2A. FIG. 6 is a flowchart corresponding to the operations shown in FIGS. 5A-5E. As shown in FIGS. 5A and 6, the operations may include forming (Block 610) sacrificial gate layers G-P on the substrate 110. The sacrificial gate layers G-P may be alternately stacked on the substrate 110 with channel layers 120.

The channel layers 120 are semiconductor layers that comprise, for example, silicon. In a subsequent process/operation, the sacrificial gate layers G-P may be replaced with a metal gate. The sacrificial gate layers G-P may comprise, for example, polysilicon or silicon germanium. Accordingly, the sacrificial gate layers G-P may have an etch selectivity relative to the channel layers 120.

In some embodiments, a middle dielectric isolation layer 130 may be between upper ones of the sacrificial gate layers G-P and lower ones of the sacrificial gate layers G-P. According to some embodiments, a layer 210 may be in a recess of the substrate 110, and an insulating layer 270 may be in the recess and on sidewalls of the channel layers 120 and sidewalls of the sacrificial gate layers G-P. For simplicity of illustration, however, the sidewalls of the channel layers 120 and the sidewalls of the sacrificial gate layers G-P are shown in FIG. 5A as being exposed.

Figure 5B:
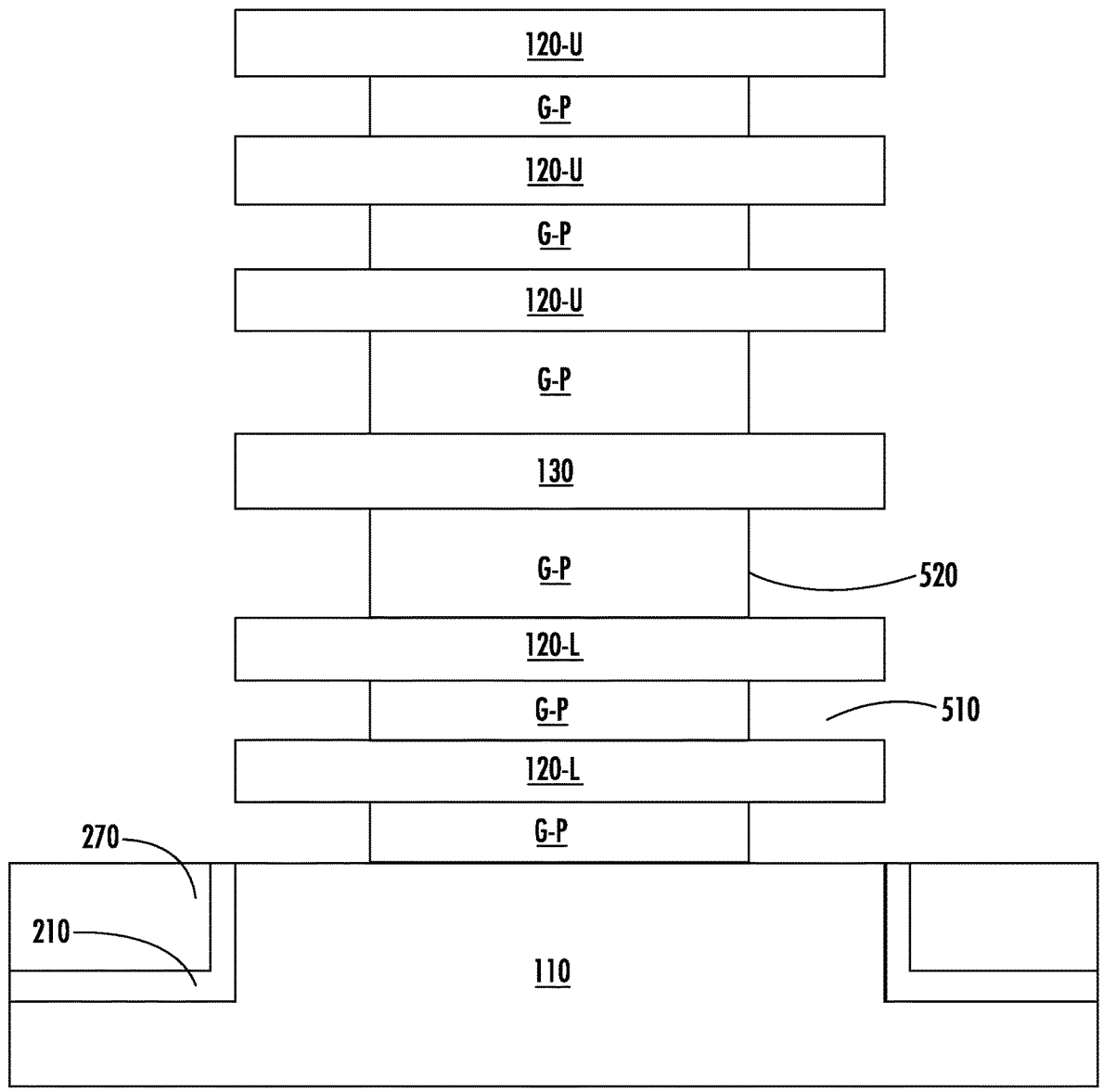
Figure 6:
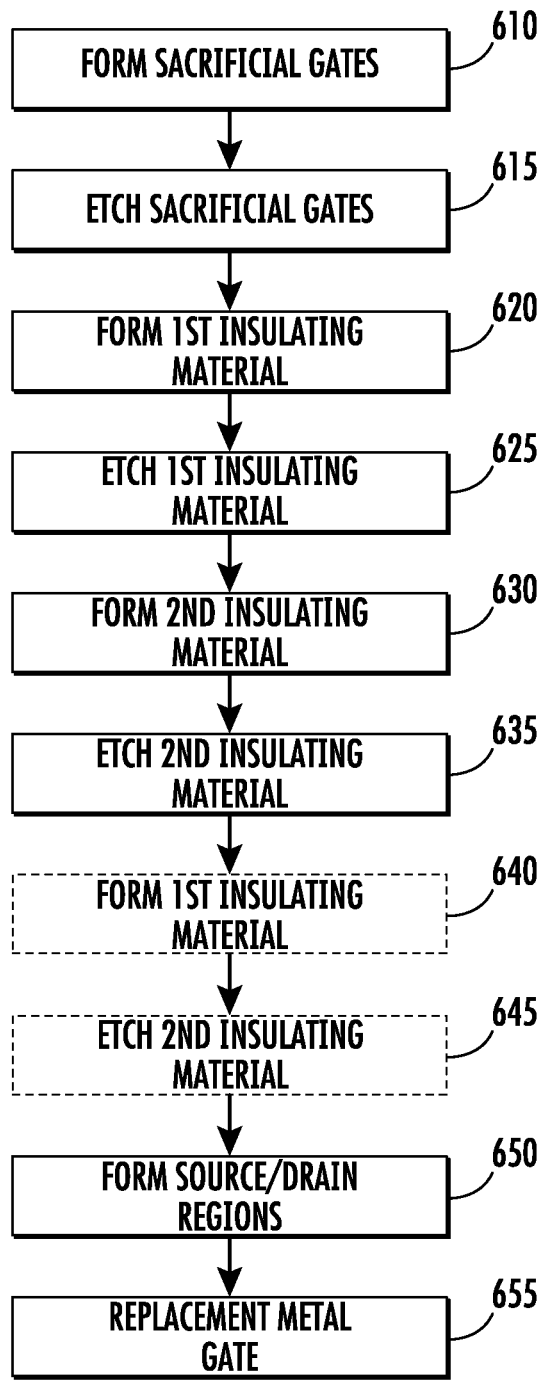
FIG. 6 is a flowchart corresponding to the operations shown in FIGS. 5A-5E.

As shown in FIGS. 5B and 6, the sacrificial gate layers G-P may be etched (Block 615). As a result, openings 510 may be formed in the sacrificial gate layers G-P between the channel layers 120. Sidewalls 520 of the sacrificial gate layers G-P may be exposed through the openings 510.

Figure 5C:
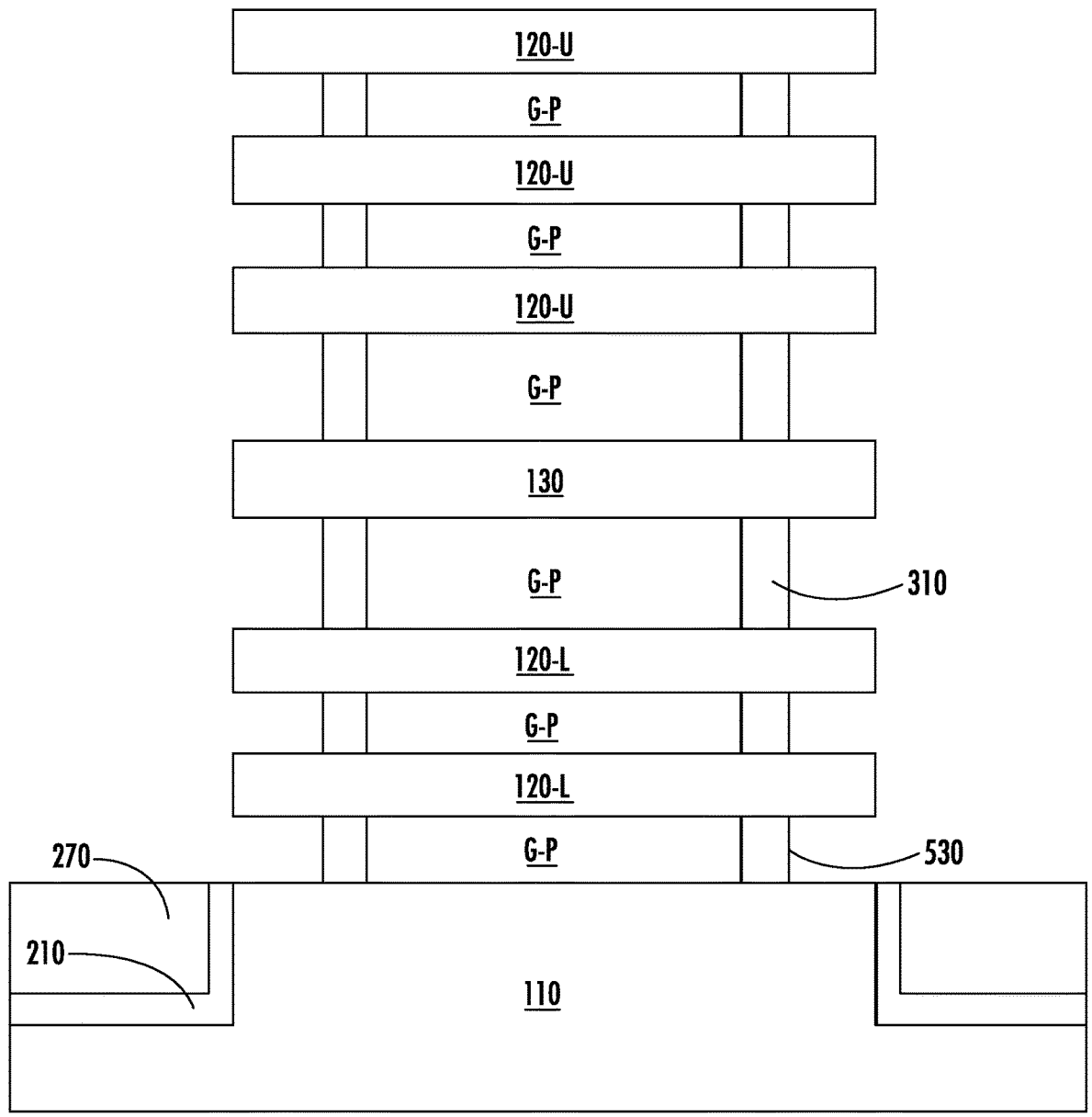

As shown in FIGS. 5C and 6, an insulating layer 310 may be formed (Block 620) on the sidewalls 520 (FIG. 5B) of the sacrificial gate layers G-P in the openings 510 (FIG. 5B). For example, the insulating layer 310 may be deposited to contact the sidewalls 520. A deposition method for the insulating layer 310 may be either a method with relatively low coverage (e.g., anisotropic growth) or a method with relatively high coverage (e.g., isotropic growth, such as Atomic Layer Deposition (ALD)).

After deposition, the insulating layer 310 may be etched (Block 625) to remove one or more portions of the insulating layer 310. As an example, a wet etch may be used to remove portions of the insulating layer 310 from upper and lower surfaces of the channel layers 120 and portions of the insulating layer 310 that protrude toward the lower S/D regions 140 and the upper S/D regions 150, thereby facilitating the shape of the insulating layer 310 shown in FIG. 3A. In another example, a wet etch may be used to remove portions of the insulating layer 310 that protrude toward the lower S/D regions 140 and the upper S/D regions 150, while portions of the insulating layer 310 contacting upper and lower surfaces of the channel layers 120 may remain, thereby facilitating the shapes of the insulating layers 340, 360 shown in FIGS. 3B and 3C. After etching the insulating layer 310, the insulating layer 310 may have an exposed sidewall 530 in an opening 510 (FIG. 5B) and may be referred to as an "outer portion" of a spacer 250.

Figure 5D:
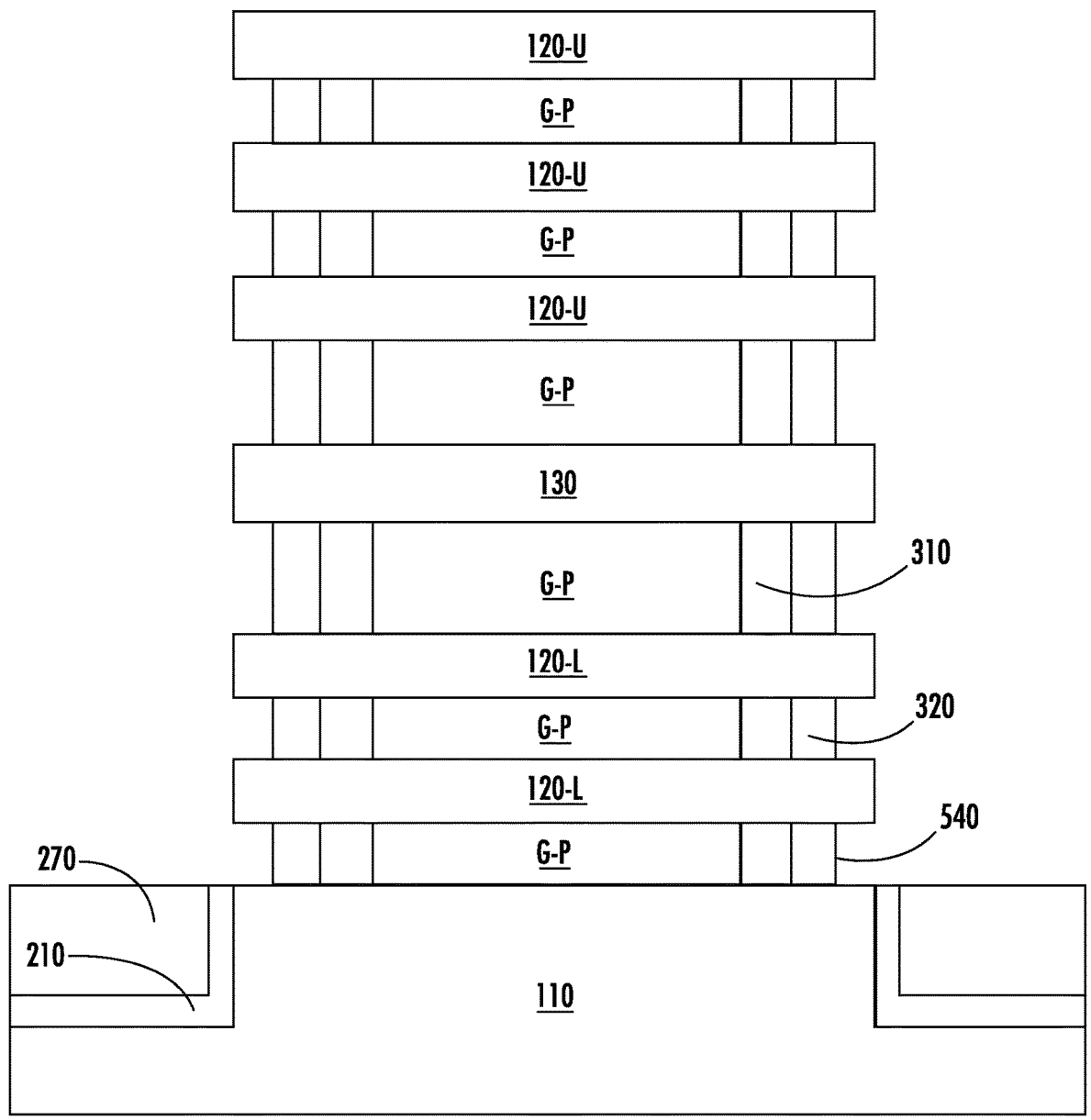
Figure 5D:
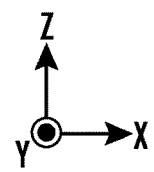

As shown in FIGS. 5D and 6, an insulating layer 320 may be formed (Block 630) on sidewalls 530 (FIG. 5C) of the insulating layer 310 in the openings 510 (FIG. 5B). The insulating layer 320 may then be etched (Block 635) to expose sidewalls 540 thereof in the openings 510. For example, the insulating layer 320 may be deposited, and then portions thereof that protrude toward the lower S/D regions 140 and the upper S/D regions 150 may be removed, thereby facilitating the shape of the insulating layer 320 shown in FIG. 3A. The insulating layer 320 may be spaced apart from a sidewall 520 (FIG. 5B) of a sacrificial gate layer G-P by the insulating layer 310. After etching the insulating layer 320, the insulating layer 320 may be referred to as an "inner portion" of a spacer 250.

Figure 5E:
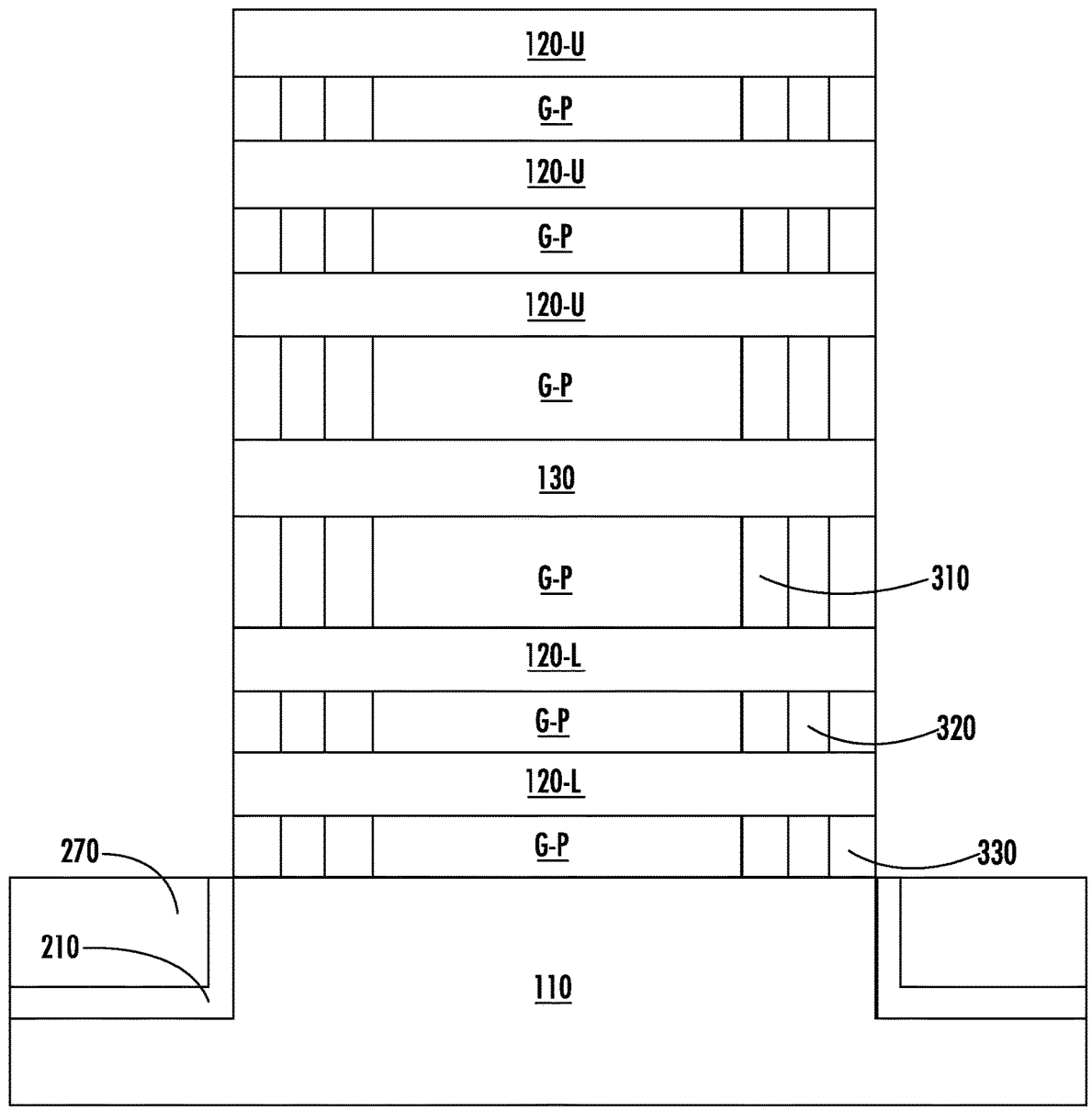

As shown in FIGS. 5E and 6, an insulating layer 330 may be formed (Block 640) on the sidewalls 540 (FIG. 5D) of the insulating layer 320 in the openings 510 (FIG. 5B). For example, the insulating layer 330 may be deposited on the sidewalls 540.

The insulating layers 310, 330 may each comprise a first insulating material (e.g., silicon nitride), and the insulating layer 320 may comprise a different, second insulating material (e.g., silicon oxide or another material having a lower dielectric constant the silicon nitride). The insulating layers 310, 330 collectively provide an outer portion of the spacer 250A (FIG. 3A), and the insulating layer 320 provides an inner portion of the spacer 250A that is bounded by the outer portion. Accordingly, the insulating layer 310 and the insulating layer 330 may be respective portions (e.g., spaced-apart, non-contiguous portions) of the first insulating material (the outer portion of the spacer 250A) that is between a pair of channel layers 120.

In some embodiments, formation (Block 640) of the insulating layer 330 may be omitted, thereby facilitating the shape of the outer portion 360 that is shown in FIG. 3C. In other embodiments, a vertical portion of the outer portion 340 that is closest to the lower S/D regions 140 and the upper S/D regions 150 may be formed by forming the insulating layer 330 to be in contact with the insulating layer 310 (after etching the insulating layer 310 such that portions of the insulating layer 310 contacting upper and lower surfaces of the channel layers 120 remain).

As shown in FIGS. 4A, 4B, and 6, the insulating layer 320 may be etched (Block 645) using an etchant that has selectivity between the insulating layer 320 and the insulating layers 310, 330. As a result, the insulating layer 320 may be removed, thereby forming a vacancy 420 (FIG. 4A) or a vacancy 450 (FIG. 4B), depending on how the etching (Block 625) of the insulating layer 310 was performed. In some embodiments, however, the operation(s) of Block 645 may be omitted, and the insulating layer 320 may thus remain in the spacers 250 (instead of forming vacancies therein).

Referring to FIGS. 1, 2A, and 6, lower S/D regions 140 and upper S/D regions 150 may be formed (Block 650) on sidewalls of the spacers 250 and on sidewalls of the channel layers 120. For example, the lower S/D regions 140 may be epitaxially grown from the lower channel layers 120-L, and the upper S/D regions 150 may be epitaxially grown from the upper channel layers 120-U. In some embodiments, the channel layers 120 may comprise silicon, and the lower S/D regions 140 and/or the upper S/D regions 150 may comprise silicon, silicon carbide, or silicon germanium.

Referring still to FIGS. 1, 2A, and 6, upper and lower metal gates G-U, G-L may be formed (Block 655) after forming the lower S/D regions 140 and the upper S/D regions 150. For example, a replacement metal gate process may be performed to replace the upper ones of the sacrificial gate layers G-P (e.g., silicon germanium) with the upper metal gate G-U, and to replace the lower ones of the sacrificial gate layers G-P with the lower metal gate G-L. Moreover, gate insulation layers may be formed between the upper metal gate G-U and the upper channel layers 120-U, and between the lower metal gate G-L and the lower channel layers 120-L.

In some embodiments, insulating spacers 240 may be formed in the lower transistor T-L (FIG. 2B) or the upper transistor T-U (FIG. 2C). For example, the spacers 240 may be formed by forming (Block 620) the first insulating material for the lower transistor T-L or the upper transistor T-U (but not both) without forming (Block 630) the second insulating material for that transistor. Moreover, the first insulating material may not be etched (Block 625) inward of a sidewall of the channel layers 120 for that transistor. Accordingly, the operations of Blocks 625-645 may be selectively omitted or performed for a particular transistor, depending on whether that transistor comprises spacers 240 or spacers 250.

Transistor stacks 101 (FIG. 1) according to embodiments herein may provide a number of advantages. These advantages include reducing capacitance (e.g., between S/D regions and a gate) by replacing silicon nitride insulating spacers on sidewalls of a gate with insulating spacers 250 (FIG. 2A) comprising an oxide (or another material having a lower dielectric constant than silicon nitride) or a vacancy. Moreover, the spacers 250 may be free of carbon. In contrast, conventional insulating spacers may be limited to transistors that are not stacked and/or may comprise carbon (e.g., silicon carbon oxynitride).

Referring to FIGS. 2A-2C, a transistor stack 101 according to embodiments herein may include insulating spacers 250 in an upper transistor T-U and/or a lower transistor T-L. The spacers 250 may be multi-layer spacers comprising different first and second insulating materials, as shown in FIGS. 3A-3C, or may comprise a vacancy (e.g., an air gap), as shown in FIGS. 4A and 4B.

Example embodiments are described herein with reference to the accompanying drawings. Many different forms and embodiments are possible without deviating from the teachings of this disclosure and so the disclosure should not be construed as limited to the example embodiments set forth herein. Rather, these example embodiments are provided so that this disclosure will be thorough and complete, and will convey the scope of the present invention to those skilled in the art. In the drawings, the sizes and relative sizes of layers and regions may be exaggerated for clarity. Like reference numbers refer to like elements throughout.

Example embodiments are described herein with reference to cross-sectional illustrations that are schematic illustrations of idealized embodiments and intermediate structures of example embodiments. As such, variations from the shapes of the illustrations as a result, for example, of manufacturing techniques and/or tolerances, are to be expected. Thus, embodiments herein should not be construed as limited to the particular shapes illustrated herein but may include deviations in shapes that result, for example, from manufacturing.

It should also be noted that in some alternate implementations, the functions/acts noted in flowchart blocks herein may occur out of the order noted in the flowcharts. For example, two blocks shown in succession may in fact be executed substantially concurrently or the blocks may sometimes be executed in the reverse order, depending upon the functionality/acts involved. Moreover, the functionality of a given block of the flowcharts and/or block diagrams may be separated into multiple blocks and/or the functionality of two or more blocks of the flowcharts and/or block diagrams may be at least partially integrated. Finally, other blocks may be added/inserted between the blocks that are illustrated, and/or blocks/operations may be omitted without departing from the scope of the present invention.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including," when used in this specification, specify the presence of the stated features, steps, operations, elements, and/or components, but do not preclude the presence or addition of one or more other features, steps, operations, elements, components, and/or groups thereof.

It will be understood that when an element is referred to as being "coupled," "connected," or "responsive" to, or "on," another element, it can be directly coupled, connected, or responsive to, or on, the other element, or intervening elements may also be present. In contrast, when an element is referred to as being "directly coupled," "directly connected," or "directly responsive" to, or "directly on," another element, there are no intervening elements present. As used herein, the term "and/or" includes any and all combinations of one or more of the associated listed items. Moreover, the symbol "/" (e.g., when used in the term "source/drain") will be understood to be equivalent to the term "and/or."

It will be understood that although the terms "first," "second," etc. may be used herein to describe various elements, these elements should not be limited by these terms. These terms are only used to distinguish one element from another. Thus, a first element could be termed a second element without departing from the teachings of the present embodiments.

Spatially relative terms, such as "beneath," "below," "lower," "above," "upper," and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if a device in the figures is turned over, elements described as "below" or "beneath" other elements or features would then be oriented "above" the other elements or features. Thus, the term "below" can encompass both an orientation of above and below. The device may be otherwise oriented (e.g., rotated 90 degrees or at other orientations) and the spatially relative descriptors used herein may be interpreted accordingly.

Many different embodiments have been disclosed herein, in connection with the above description and the drawings. It will be understood that it would be unduly repetitious and obfuscating to literally describe and illustrate every combination and subcombination of these embodiments. Accordingly, the present specification, including the drawings, shall be construed to constitute a complete written description of all combinations and subcombinations of the embodiments described herein, and of the manner and process of making and using them, and shall support claims to any such combination or subcombination.

The above-disclosed subject matter is to be considered illustrative, and not restrictive, and the appended claims are intended to cover all such modifications, enhancements, and other embodiments, which fall within the scope of the present invention. Thus, to the maximum extent allowed by law, the scope is to be determined by the broadest permissible interpretation of the following claims and their equivalents, and shall not be restricted or limited by the foregoing detailed description.

What is claimed is:

1. A transistor device comprising:
a substrate; and
a transistor stack comprising first and second transistors on the substrate,
wherein the first transistor comprises:
a plurality of first semiconductor channel layers extending in a direction that is parallel with an upper surface of the substrate;
a first gate between the plurality of first semiconductor channel layers; and
a first insulating spacer that is on a sidewall of the first gate and between the plurality of first semiconductor channel layers, the first insulating spacer comprising an inner portion and an outer portion,
wherein the outer portion comprises a first portion and a second portion,
wherein the inner portion is between the first portion and the second portion in the direction,
wherein the inner portion comprises an oxide or a vacancy, and
wherein the inner portion is spaced apart from the first gate by the outer portion.

2. The transistor device of claim 1, wherein the outer portion of the first insulating spacer comprises a nitride, and wherein a cross-section of the inner portion is bounded by the outer portion on at least two sides.

3. The transistor device of claim 2, wherein ones of the plurality of first semiconductor channel layers and the first gate are in direct contact with each other.

4. The transistor device of claim 2, wherein the inner portion and the outer portion comprise silicon oxide and silicon nitride, respectively.

5. The transistor device of claim 2, wherein the outer portion comprises silicon nitride.

6. The transistor device of claim 2, wherein the cross-section of the inner portion is bounded by the outer portion on three sides.

7. The transistor device of claim 2, wherein the cross-section of the inner portion is bounded by the outer portion on four sides.

8. The transistor device of claim 1, wherein the second transistor comprises:
a plurality of second semiconductor channel layers;
a second gate between the plurality of second semiconductor channel layers; and
a second insulating spacer that is on a sidewall of the second gate and between the plurality of second semiconductor channel layers.

9. The transistor device of claim 8, wherein the second insulating spacer comprises an inner portion that comprises an oxide or a vacancy.

10. The transistor device of claim 9, wherein the inner portion of the second insulating spacer is aligned with the inner portion of the first insulating spacer.

11. The transistor device of claim 1, further comprising a source/drain (S/D) region that is electrically connected to the plurality of first semiconductor channel layers,
wherein the first insulating spacer contacts the S/D region.

12. The transistor device of claim 1,
wherein the first and second transistors are NMOS and PMOS transistors, respectively, and
wherein the first transistor is between the second transistor and the substrate.

13. A transistor device comprising:
a substrate; and
a transistor stack comprising first and second transistors on the substrate,
wherein the first transistor or the second transistor comprises:
a plurality of semiconductor channel layers extending in a direction that is parallel with an upper surface of the substrate;
a gate on the plurality of semiconductor channel layers; and
an insulating spacer that is on a sidewall of the gate and between the plurality of semiconductor channel layers, and
wherein the insulating spacer comprises:
an outer portion on a sidewall of the gate; and
an inner portion that is spaced apart from the sidewall of the gate by the outer portion, and that comprises a lower dielectric constant than the outer portion,
wherein the outer portion comprises a first portion and a second portion,
wherein the inner portion is between the first portion and the second portion in the direction.

14. The transistor device of claim 13,
wherein the insulating spacer is free of carbon,
wherein the outer portion comprises silicon nitride, and
wherein the inner portion comprises silicon oxide or a vacancy.

15. The transistor device of claim 13, wherein a vertical thickness of the inner portion is equal to a vertical thickness of the outer portion.

16. A transistor device comprising:
a substrate; and
a transistor stack comprising first and second transistors on the substrate,
wherein the first transistor comprises:
a plurality of semiconductor channel layers extending in a direction that is parallel with an upper surface of the substrate;
a gate between the plurality of semiconductor channel layers; and
an insulating spacer that is on a sidewall of the gate and between the plurality of semiconductor channel layers, the insulating spacer comprising an inner portion and an outer portion,
wherein the outer portion comprises a first portion and a second portion,
wherein the inner portion is between the first portion and the second portion in the direction,
wherein the inner portion comprises an oxide or a vacancy,
wherein the insulating spacer is free of carbon,
wherein the inner portion is free of nitrogen, and
wherein the inner portion is spaced apart from the gate by the outer portion.

17. The transistor device of claim 16,
wherein the outer portion of the insulating spacer comprises a nitride, and
wherein a cross-section of the inner portion is bounded by the outer portion on at least two sides.

18. The transistor device of claim 17, wherein ones of the plurality of semiconductor channel layers and the gate are in direct contact with each other.

19. The transistor device of claim 17, wherein the inner portion and the outer portion comprise silicon oxide and silicon nitride, respectively.

20. The transistor device of claim 17, wherein the outer portion comprises silicon nitride.

* * * * *